United States Patent [19]

Bean

[11] 3,884,733

[45] May 20, 1975

[54] DIELECTRIC ISOLATION PROCESS

[75] Inventor: Kenneth Elwood Bean, Richardson, Tex.

[73] Assignee: Texas Instruments Incorporated, Dallas, Tex.

[22] Filed: Feb. 19, 1974

[21] Appl. No.: 443,290

Related U.S. Application Data

[63] Continuation of Ser. No. 171,665, Aug. 13, 1971, abandoned.

[52] U.S. Cl. .................... 148/175; 29/578; 29/580; 29/589; 117/212; 117/213; 117/215; 317/101 A; 357/31; 357/40; 357/49; 357/50; 357/55; 357/60

[51] Int. Cl. .......................... H01l 7/36; H01l 27/04

[58] Field of Search ...... 148/174, 175; 29/578, 580, 29/589; 357/49, 50; 117/212, 213, 215, 201; 317/101 A

[56] References Cited

UNITED STATES PATENTS

| | | | |
|---|---|---|---|
| 3,100,276 | 8/1963 | Meyer | 357/50 |
| 3,133,336 | 5/1964 | Marinace | 148/175 X |
| 3,320,485 | 5/1967 | Buie | 357/49 X |
| 3,393,349 | 7/1968 | Huffman | 317/101 |
| 3,456,335 | 7/1969 | Hennings et al. | 29/579 |
| 3,461,003 | 8/1969 | Jackson | 148/175 |
| 3,579,057 | 5/1971 | Stoller | 357/50 X |
| 3,609,375 | 9/1971 | Bloom | 357/49 X |
| 3,776,788 | 12/1973 | Henker | 148/175 X |

OTHER PUBLICATIONS

Bean et al., "Influence of Crystal Orientation–Processing," Proc. IEEE, Vol. 57, No. 9, Sept. 1969, p. 1469–1476.

*Primary Examiner*—L. Dewayne Rutledge
*Assistant Examiner*—W. G. Saba
*Attorney, Agent, or Firm*—Harold Levine; James T. Comfort; Gary C. Honeycutt

[57] ABSTRACT

A method of epitaxially depositing onto a semiconductor substrate by planarizing the deposition surface of the substrate substantially parallel to a predetermined crystallographic plane, forming a deposition mask which exposes a predetermined site on the surface of the substrate, and epitaxially depositing semiconductor material in a preferred growth direction at the exposed site to produce a monocrystalline structure. A plurality of sites may be exposed through the deposition mask to permit formation of a plurality of discrete monocrystalline structures having predetermined spacing. Layers of different conductivity types can be formed in the structures by selective doping during deposition. Monocrystalline structures formed by the above method may be coated with a dielectric material and further processed to produce semiconductor devices for use in integrated circuits. If the monocrystalline structures are suitably arrayed and of a different conductivity type than the substrate, thus yielding semiconductor diodes, they can be utilized as a target in a vidicon tube.

7 Claims, 24 Drawing Figures

DIELECTRIC ISOLATION PROCESS

This is a continuation of application Ser. No. 171,665, filed Aug. 13, 1971, now abandoned.

This invention relates to formation of semiconductor bodies and more particularly to epitaxial deposition of monocrystalline structures in a preselected growth direction from a surface of a monocrystalline semiconductor substrate planarized substantially parallel to a predetermined crystallographic plane of the substrate.

In the preparation of dielectrically isolated components for integrated circuits, a number of process steps are generally required. One presently known method for producing dielectrically isolated components from monocrystalline silicon includes the steps of preparing a semiconductor substrate of a first conductivity type, epitaxially depositing material of a second conductivity type on the substrate, forming an etch mask on the surface of the epitaxial material and etching channels in the epitaxial material to leave mesas or islands therein. These channels are usually etched through the epitaxial material to a depth sufficient to reach the substrate. A dielectric material such as silicon dioxide is thereafter formed in the channels. Polycrystalline silicon is then deposited on the silicon dioxide to provide a backing to facilitate further handling. The original substrate is then removed by lapping, grinding and polishing to leave exposed dielectrically isolated islands of epitaxial silicon. Semiconductor components or devices are then formed in the islands by conventional diffusion techniques.

Dielectric isolation procedures which provide better process control and greater yield usually require even more process steps than above described. Various dielectric isolation processes are disclosed in an article entitled "Dielectric Isolated Integrated Circuit Substrate Processes", by U.S. Davidsohn and Faith Lee, *Proceedings of the IEEE*, Volume 57, Number 9, September 1969, pages 1532–1537.

In most prior dielectric isolation processes, only one surface of a potential component site is exposed for formation of a component and for ohmically contacting the various portions thereof with leads. In many cases, it is desirable to be able to expose an upper and lower surface of a potential component site to allow lead contacts on both sides of the device and gold doping of selected devices or circuits. It is desirable to form a component and isolate it at the same time. In addition, it is desirable to reduce the total number of steps required to produce dielectrically isolated components for integrated circuits.

Vidicon tubes have heretofore utilized a target comprising a silicon wafer containing many photodiodes. Such semiconductor targets have been prepared by diffusing p-type material into a thin n-type substrate through a silicon dioxide layer having many openings in a predetermined array. Each of the p-n junctions forms a photodiode. An electron beam scans the back side or silicon dioxide side of the array and charges the photodiodes to a negative potential. Photons entering from the opposite side of the target cause the diodes to discharge. Recharging of the diode by the electron beam creats a desired video signal read at a video amplifier load electrically connected to the target.

A problem existing with a target of the type described above is that the electron beam will not only charge the diodes but will also charge the silicon dioxide layer on the substrate. This can cause failure in interrogation of the diodes by the electron beam. It is also possible for the electron beam to be repelled back toward the electron gun when the negative charge on the silicon dioxide layer becomes too high. One method for overcoming this inherent disadvantage is to apply a semiinsulating film over the entire oxide layer. This will prevent the silicon dioxide from accumulating a charge. However, the semiinsulating film can create other problems such as shorting of adjacent diodes. It is, therefore, desirable to produce a diode array which can eliminate both the problems of charge accumulation in the silicon dioxide and diode shorting by the semiinsulating film.

The present invention provides an improved method for the production of arrays of dielectrically isolated single crystal semiconductors which may be employed, for example, in integrated circuits or used as targets in vidicon tubes. The method of the present invention may be generally described as including the steps of forming a planar surface on a substrate of monocrystalline semiconductor material substantially parallel to a predetermined crystallographic plane, applying a mask to the surface having apertures exposing the surface at predetermined sites, and epitaxially depositing semiconductor material on the exposed sites to form discrete monocrystalline structures.

A better understanding of the present invention can be acquired by reading the ensuing specification in conjunction with the accompanying drawings, wherein.

Figure 1:
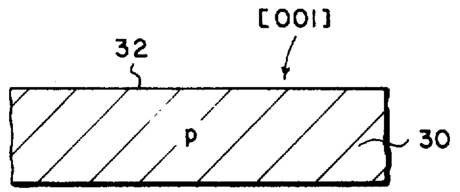
FIG. 1–4 are cross-sectional views which illustrate various stages during the production of a semiconductor structure by the present invention.

The present invention may take several forms. One of the preferred embodiments is illustrated in FIGS. 1–4 to which reference is made herein. FIG. 1 illustrates a substrate 30 of monocrystalline silicon having, for example, p-type conductivity. Substrate 30 is sliced from an ingot so that its surface 32 is substantially coplanar with a predetermined crystallographic plane of the silicon, in this instance a (001) plane. After removal from the ingot, the surface 32 is finished by conventional lapping, grinding and chemical polishing techniques.

Figure 2:
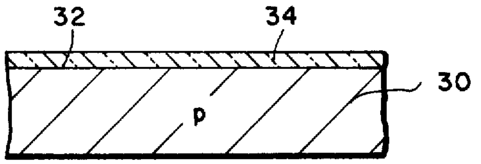
Figure 3:
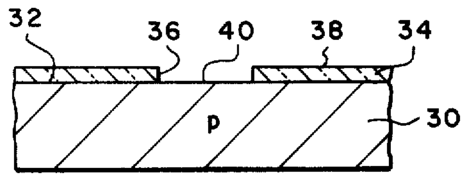

As illustrated in FIG. 2, a layer of silicon dioxide 34 is then formed on the surface 32 of the substrate 30 by conventional techniques. Then, as illustrated in FIG. 3, a plurality of windows 36, only one of which is illustrated, are etched in the silicon dioxide layer 34 to produce a deposition mask having a desired pattern. The window 36 is illustrated as being square but may be round or any other shape. The pattern can be produced by conventional photoresist techniques wherein a layer of photoresist emulsion such as Kodak Metal Etch Resist (KMER) is formed on the top surface 38 of the silicon dioxide layer 34. Thereafter, the emulsion is photographically exposed in predetermined areas and developed. The undeveloped material is removed exposing portions of the silicon dioxide. Thereafter, the exposed silicon dioxide can be etched by conventional techniques using an etchant containing hydrofluoric acid. Etching of the silicon dioxide exposes a site 40 on substrate 30 through window 36.

Figure 4:
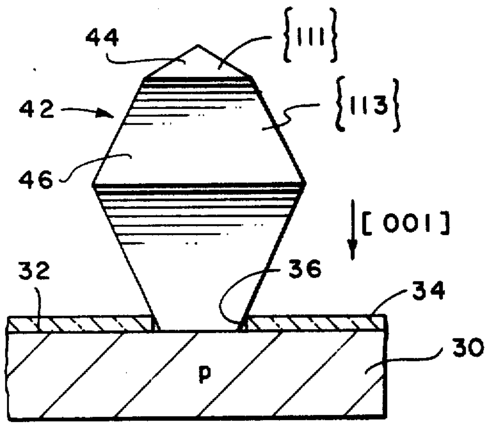

Thereafter, the masked substrate 30 is placed in an epitaxial furnace where an epitaxial silicon structure 42, as shown in FIG. 4, is grown on the surface 40 exposed through window 36. The direction of growth of the structure 42 is dependent upon the crystallographic orientation of the surface 32 of the original substrate 30. The epitaxial growth rate normal to certain crystallographic planes exceeds the growth rate in other planes which intersect these certain planes. The growth rate in the <001>, <111> and <110> directions are relatively high compared to growth rates in other crystallographic directions. The surface 32 of substrate 30 has, as explained above, been planarized parallel to one of the {001} planes, and the principal growth of the structure 42 has preferentially taken place in the <001> direction.

Growth normal to a predetermined plane or family of planes occurs even though such planes are not coplanar with the surface 32, but intersect the surface 32 at some angle. Growth in a direction normal to a plane intersecting a monocrystalline substrate surface will result in a structure having a characteristic tilt with respect to that surface. For most applications, the growth surface will be substantially parallel with one of the selected crystallographic planes. However, for some applications, it will be desirable to orient the growth surface at an angle to one of the high growth rate planes.

Figure 5:
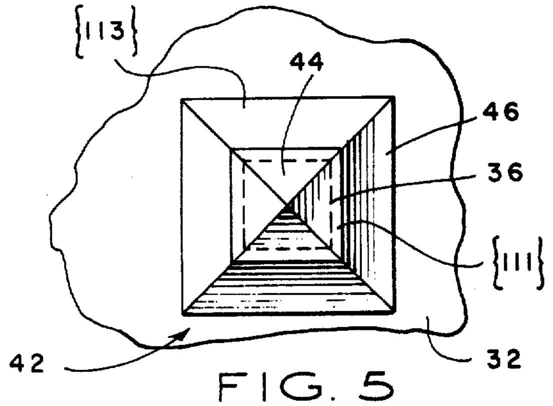
FIG. 5 is a top view of the structure illustrated in FIG. 4.
Figure 6:
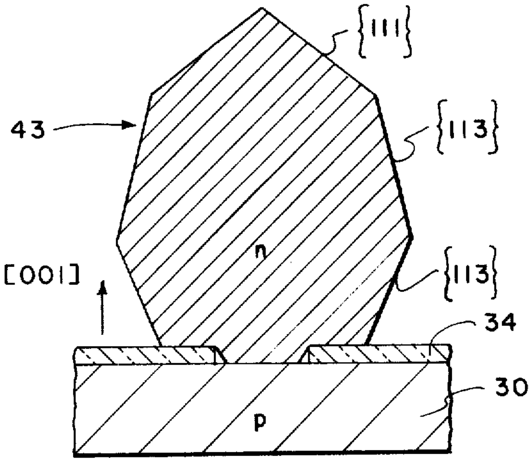
FIG. 6 is a cross-sectional view of a semiconductor structure similar to that shown in FIG. 4.

The choice of planes with which the surface 32 is coplanarized will also dictate the shape of the epitaxial structure 42. Orientation dependent epitaxial growth of the structure 42 in the <001> directions will produce a characteristic shape as shown in FIGS. 4 and 5, the latter being a top view of the structure 42 of FIG. 4. The structure 42 is bounded on all sides by surfaces coplanar with other crystallographic planes of silicon. For example, the top surfaces 44 are bounded by planes of the {111} family. The surfaces 46 are bounded by planes of the {113} family. The structure 42 grown from a window 36 in the silicon dioxide layer 34 takes on a faceted square shape. If growth of the crystal shown in FIGS. 4 and 5 is continued, the structure 42 will continue to expand to form a structure 43 as shown in FIG. 6. The bottom of the structure 43 overlaps the silicon dioxide layer 34 and the surfaces parallel to the {111} planes and {113} planes are larger.

Figure 7:
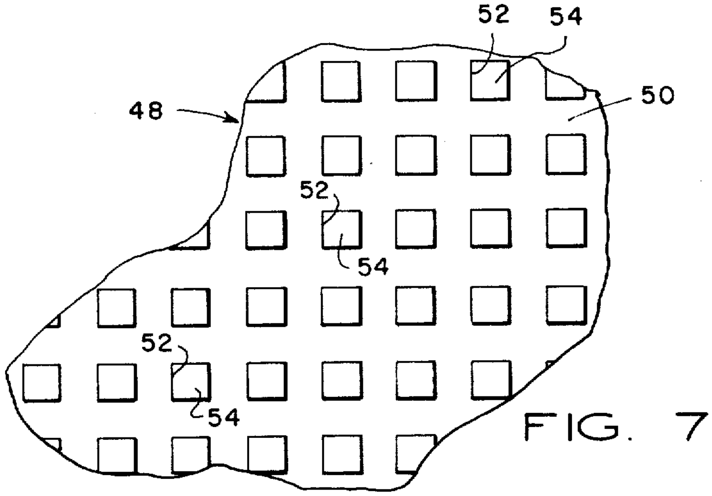
FIG. 7 is a top plan view illustrating a portion of a semiconductor substrate with a mask prepared for growth of a vidicon tube target diode array.

A plurality of the monocrystalline structures may be grown in a predetermined array. More particularly, FIG. 7 illustrates a greatly enlarged top view of a portion of a wafer 48 of n-type monocrystalline silicon coated with a layer 50 of silicon dioxide. A plurality of rectangular windows 52 have been formed in the oxide layer 50 by photoresist methods. Preselected sites 54 on the monocrystalline silicon substrate are thus exposed through the windows 52. The silicon substrate has been planarized in a manner similar to that shown in connection with FIGS. 1-3 so that the surfaces of the exposed portions 54 are parallel with {001} crystallographic planes of the silicon substrate. The wafer 48 in actual size may have a diameter, for example, of about 0.875 inches. It may be lapped, ground and polished to a thickness of less than about 1 mil. The windows 52 may be on centers on the order of 12.5 microns. Thus, a slice can contain about 2.4 million windows or about 620,000 windows per square centimeter.

Figure 8:
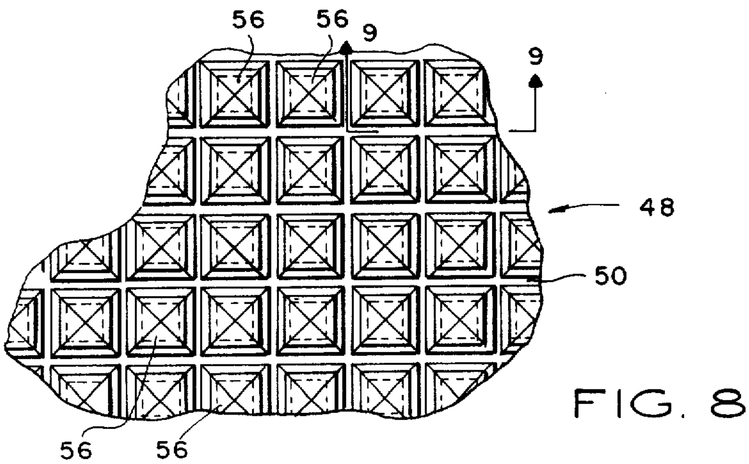
FIG. 8 is a top plan view illustrating epitaxial structures grown through the mask of FIG. 7 in accordance with the present invention.
Figure 9:
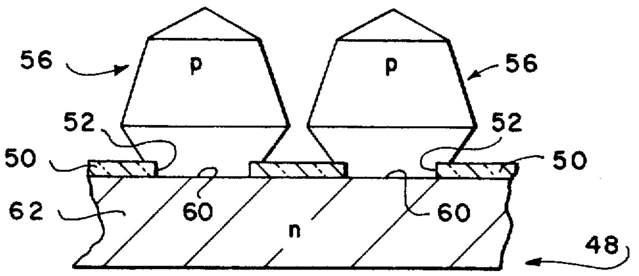
FIG. 9 is an enlarged, partial cross-sectional view along line 9—9 of FIG. 8.

A plurality of monocrystalline epitaxial structures 56, as illustrated in FIG. 8, may then be grown on the exposed silicon surfaces 54 through the windows 52. The epitaxial structures 56 can be selectively doped with, for example, diborane ($B_2H_6$), to render them of p-type conductivity. These structures are allowed to grow until they have extended laterally beyond the windows 54 and reached a spacing of just a few microns. The structures may be grown vertically from the surface 54 to a height on the order of several microns. Thus, when viewing the wafer 48 as shown in enlarged partial cross-section in FIG. 9, it is seen that a large percentage of the surface area of the wafer 48 can be covered by the epitaxial structures 56. Each of the p-n junctions 60 between the epitaxial structures 56 and the n-type substrates 62 form semiconductor diodes.

Figure 11:
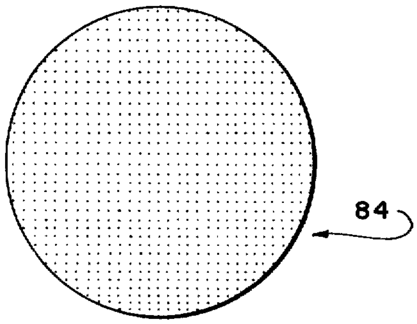
FIG. 11 is a top plan view of the target used in the tube of FIG. 10.
Figure 10:
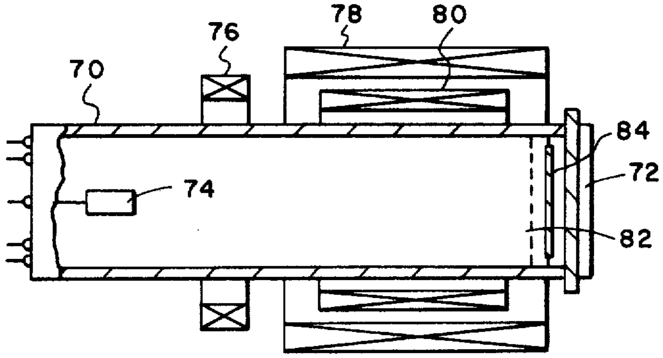
FIG. 10 is a simplified representation, in partial cross-section, of a vidicon image tube.

One application for the diode array produced in accord with the above steps is in a vidicon image tube. One such tube is illustrated in FIG. 10. The tube includes an envelope 70 which is evacuated and has a glass face plate 72 at one end. A cathode 74 of an electron gun is fitted to the opposite end of the tube 70. Cathode 74 is designed to direct an electron beam toward the opposite end of the tube 70. An alignment coil 76, a horizontal deflection coil 78, and a vertical deflection coil 80, controlled by external circuitry (not shown), are fitted about the tube 70. A field mesh 82 for the electron gun is fitted near the face plate 72. A target 84, shown in plan view in FIG. 11, is positioned intermediate the face plate 72 and the field mesh 82. Target 84, composed of a diode array, is prepared in accordance with the procedure described in connection with FIGS. 7–9. As noted above, the diodes may be spaced on approximately 12.5 micrometer centers, the p-type epitaxial structures 56 being physically spaced from periphery to periphery by a few micrometers. Appropriate conventional circuitry is interconnected with the diode array target 84 to provide a video output signal which can be converted to a visable display.

Figure 12:
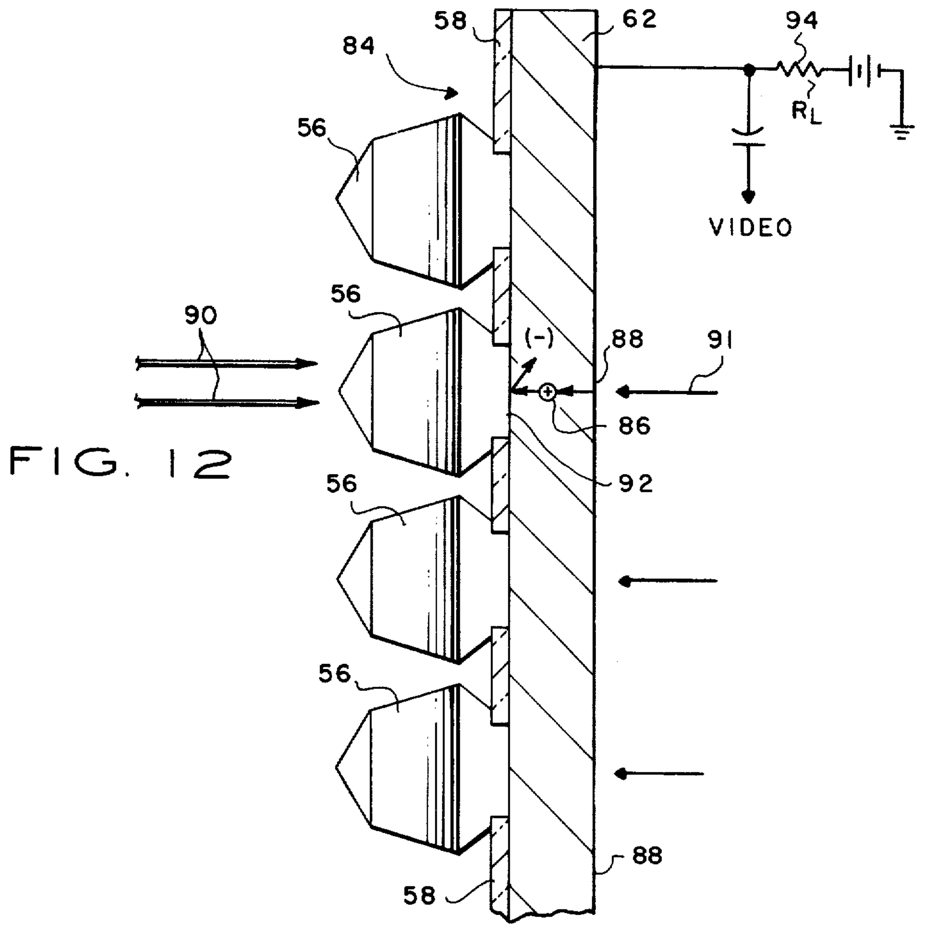
FIG. 12 is an enlarged, partial cross-sectional view of a portion of the target of FIG. 10.

The operation of the vidicon tube and particularly the target 84 as shown in partial cross section in FIG. 12 will now be described. An electron beam denoted by arrows 90 scans the side of the target 84 containing epitaxial structures 56. A standard 1,000 × 750 array of the diodes is scanned in a standard one-half by three-eighths inch raster area on the 0.875 inch diameter target 84. The substrate 62 is held at a nominal 10 volts positive relative to the cathode 74 (FIG. 10) of the vidicon tube. The electron beam deposits electrons on the p-type epitaxial structures 56 charging them to cathode potential. The diodes remain charged until the depletion layer capacitance, which is a measure of the diode charge-storing capability, is discharged by light created minority carriers (holes), schematically indicated at 86, or by diode leakage. The holes 86 are generated at the surface 88 by photons, indicated by arrows 91, striking the light incident surface 88. The holes 86 are swept across the depletion region 92 to the diode p-type region (the epitaxial structure 56) and contribute to the leakage current. Recharging of the diode by the electron beam creates a desired video signal at a video amplifier load resistor $R_L$ 94. The signal read at the load resistor $R_L$ is synchronized with the electron beam position on the array to provide a useful video output. Since all the holes 86 reaching a diode during the scan time contribute to the discharging of the diode, the video output signal is proportional to the integrated local photon flux.

The diode array prepared in accordance with the procedures described above has significant advantages over arrays of the prior art. The array of the present invention does not require the presence of a semiinsulating film over the silicon dioxide layer 58 to prevent charge build-up in the silicon dioxide. This is caused by two factors resulting from the presence of the epitaxial structures 56. First, the epitaxial structures extend a significant distance above the silicon dioxide layer, thus minimizing any charge build-up of the silicon dioxide layer. Second, the epitaxial structures 56 spread over a substantial percentage of the silicon dioxide layer thus giving a greater target area for the electron beam 90. Furthermore, the p-n junction and consequently the depletion region 92 are superior to those achievable with diffusion techniques used in prior targets.

Figure 13:
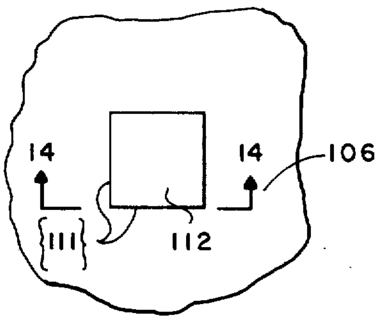
FIG. 13 is a top plan view of an epitaxially deposited structure grown in a <110> direction from a semiconductor substrate.
Figure 14:
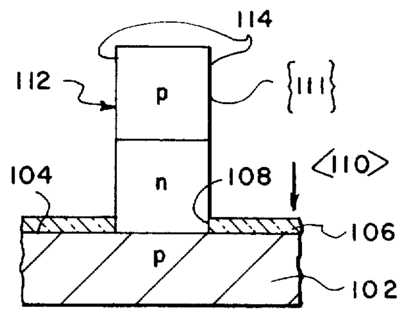
FIG. 14 is a cross-sectional view taken along line 14—14 of FIG. 13.

In another aspect of the present invention, orientation dependent epitaxial structures can be grown for the purpose of producing dielectrically isolated components for integrated circuits. One such structure is shown in FIGS. 13 and 14. Referring to FIGS. 13 and 14, a substrate 102 of monocrystalline silicon is prepared in accordance with the process steps discussed in connection with FIGS. 1–3. The substrate 102 has an upper surface 104 which is, however, planarized parallel to one of the {110} crystallographic planes. A layer 106 of silicon dioxide is formed on the surface 104. A window 108 is formed therein by conventional photoresist techniques. The structure 112 is epitaxially grown in the <110> direction through window 108 in the oxide layer 106. It is characterized by side walls 114 perpendicular to the surface 104. These side walls 114 are parallel to the {111} planes and perpendicular to the surface 104. In top view, the structure 112 has a rectangular shape dictated by the {111} planes.

Figure 15:
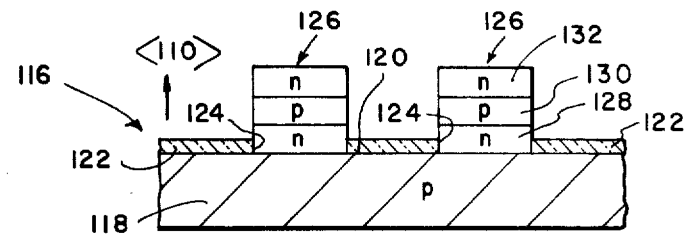
FIG. 15 is a cross-sectional view of selectively doped structures grown from a substrate in the <110> direction.

A dielectrically isolated integrated circuit may be prepared utilizing an epitaxial structure similar to structure 112 shown in FIGS. 13 and 14. More particularly, and with reference to FIG. 15, a wafer, generally designated 116, comprises a monocrystalline silicon substrate 118 having an upper surface 120 planarized parallel to one of the {110} planes. A layer 122 of silicon dioxide has been deposited on the surface 120. Windows 124 have been opened in the layer 122 by photoresist techniques and an epitaxial, single crystal structure 126 grown on the substrate. During the epitaxial deposition, the silicon was selectively doped to produce layers 128, 130 and 132 in the structures 126 having conductivities of n-, p- and n-types, respectively. It is understood that the sequence of conductivity types is dependent only upon the final epitaxial structure 126 desired for a particular application.

Figure 16:
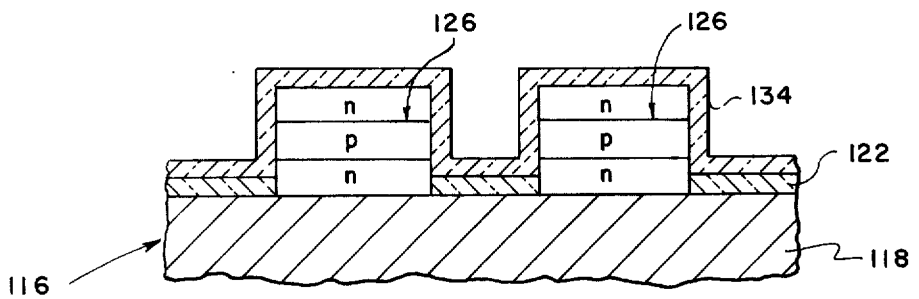
FIGS. 16–22 are cross-sectional views of a semiconductor wafer illustrating progressive stages in the manufacture of a portion of an integrated circuit according to the present invention.
Figure 17:
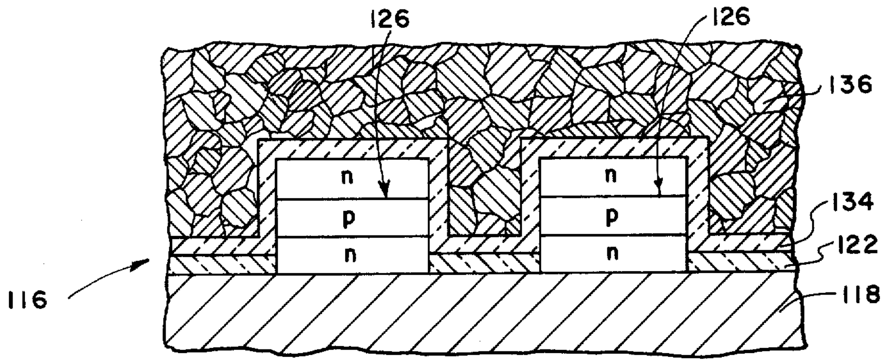
Figure 18:
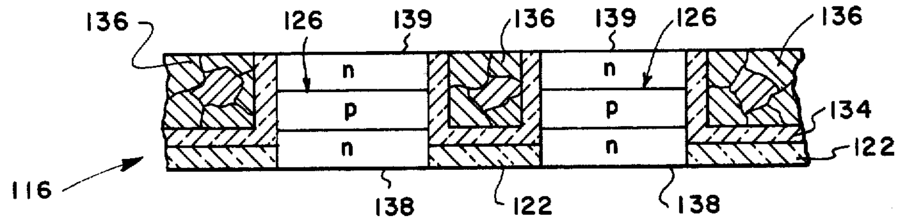
Figure 19:
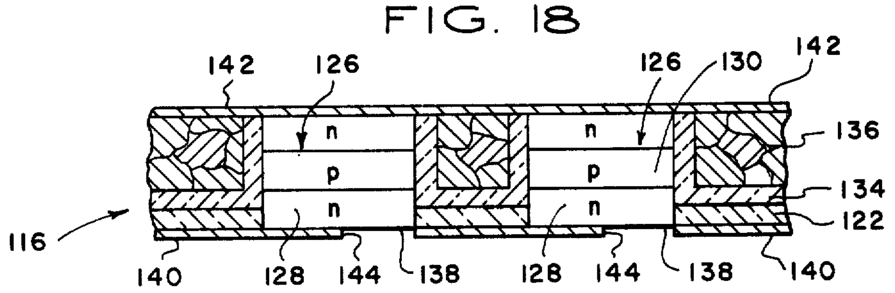

A layer 134 of silicon dioxide is deposited on the structure as shown in FIG. 16. A layer 136 of polycrystalline silicon (FIG. 17) is then deposited on the silicon dioxide layer 134. As shown in FIG. 18, the original substrate 118 is then removed from the wafer 116 by lapping, grinding and mechanically and chemically polishing to expose surfaces 138 of the epitaxial structures 126. The top of the wafer 116 may also be planarized by lapping, grinding and mechanically and chemically polishing to expose the surfaces 139 of the epitaxial structures 126. Thereafter, as shown in FIG. 19, thin layers of silicon dioxide including bottom layer 140 and top layer 142, are formed on the wafer 116. Windows 144 are etched in the bottom layer 140 by means of conventional photoresist techniques to expose a portion of the surfaces 138 of n-type layers 128.

Figure 20:
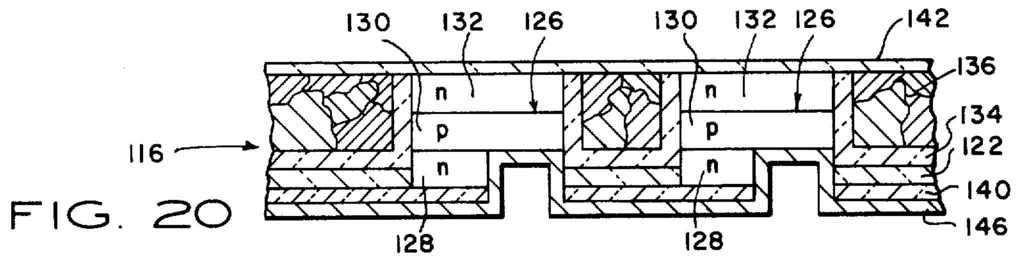
Figure 21:
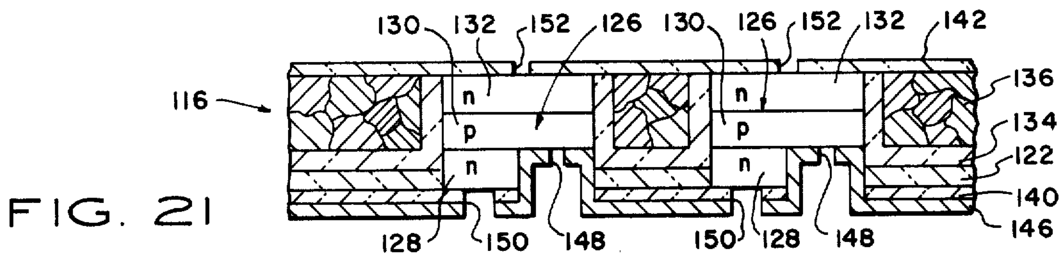

Thereafter, a portion of the n-type layers 128 is selectively etched to p-type layer 130 as shown in FIG. 20. Etchants, such as a mixture of potassium hydroxide, n-propanol and water, are available which will preferentially etch the n-type layer 128 substantially perpendicular to its surface with this particular crystallographic orientation. The etch can also be timed to stop at the junction between n-type layer 128 and p-type layer 130. Thereafter, another layer 146 of silicon dioxide or the like is deposited on the top of the body. Referring to FIG. 21, photoresist techniques are utilized to open a window 148 in oxide layer 146 to expose a portion of p-type layer 130. Likewise, a window 150 can be opened through layers 146 and 140 to expose a portion of n-type layer 128. A window 152 can be opened in layer 142 to expose a portion of n-type layer 132.

Figure 22:
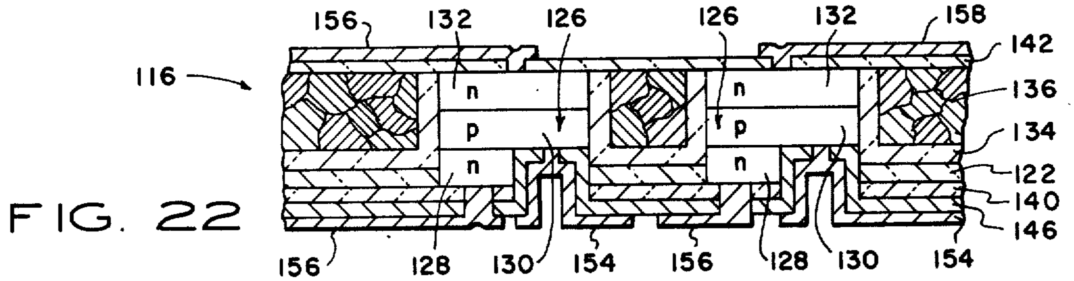

A layer of metal is then deposited or sputtered by conventional techniques onto both surfaces of the wafer 116. As shown in FIG. 22, the metallization layer is then masked in a predetermined pattern and selectively etched to form ohmic leads 154, 156 and 158 to and from the various portions of the structures 126. Thus epitaxial structures 126 have been converted to dielectrically isolated components in the form of n-p-n transistors foor an integrated circuit device. The integrated circuit device as shown in FIG. 22 can then be packaged in a hermetic container in accordance with common practice.

As explained in conjunction with FIGS. 15–22, n-p-n transistors have been formed in very thin layers with fewer process steps than required in other dielectric isolation processes. The process of the present invention for producing such dielectrically isolated integrated circuits has other advantages including lower cost resulting from fewer process steps, a high number of components per unit of wafer volume, uniformity of components, and both front and back surface contacting with ohmic leads. Other advantages will be apparent to those of ordinary skill in the art.

Figure 23:
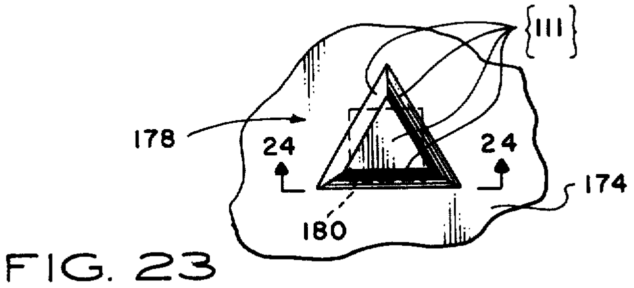
FIG. 23 is a top plan view of an epitaxially deposited structure grown in the <111> direction from a semiconductor substrate.
Figure 24:
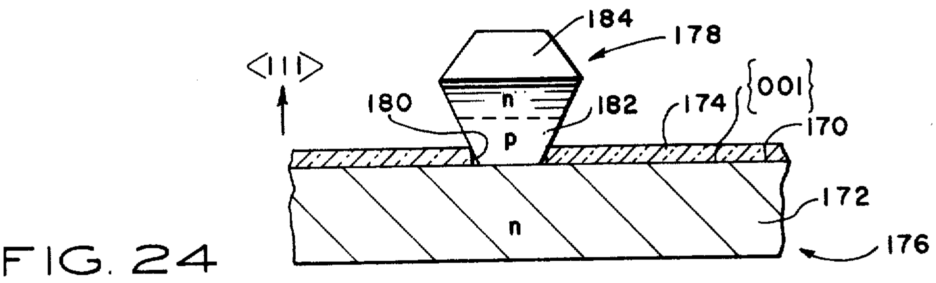
FIG. 24 is a cross-sectional view taken along line 24—24 of FIG. 23.

Another form of the invention is illustrated in FIGS. 23 and 24. In this embodiment, a surface 170 of an n-type silicon substrate 172 is planarized parallel to one of the {111} crystallographic planes. A deposition mask 174 of silicon dioxide is formed on surface 170. The entire wafer 176 is placed in an epitaxial reactor where the epitaxial structure 178 is grown through a window 180 in the mask 174. As can be seen by reference to FIG. 23, a top view, the structure 178 has a triangular shape. The sides of the structure 178 as shown in FIGS. 23 and 24 are bounded by {111} planes. As shown, the structure 178 has been selectively doped to produce a p-type layer 182 and an n-type layer 184.

In an exemplary epitaxial deposition, a wafer is prepared having a deposition mask of predetermined configuration on a surface thereof planarized parallel to a {001} plane. It is placed in a conventional rotating susceptor, multiple slice, vertical, epitaxial reactor. The reactor is first cleared of contaminant gases by introducing and exhausting forming gas (a mixture of 90% by weight nitrogen and 10% by weight hydrogen). The reactor is then raised to a temperature of about 1150°C (uncorrected for optical emissivity). Thereafter, a reactant such as trichlorosilane, or other gaseous silicon compound such as silane or other halogenated silanes, is introduced into the reactor. A typical ratio of trichlorosilane to hydrogen carrier is about 0.5 to 99.5% by weight. A small amount of a dopant can also be introduced along with the trichlorosilane. It is understood that the choice of dopants depends on the conductivity desired in the layer being deposited, which in turn is dictated by the use to which the end structure will be put. Under these conditions an epitaxial structure such as shown in FIGS. 4 and 5 can be grown to a height of about 2 to 3 microns in about 3 minutes.

With respect to all of the foregoing embodiments, control of the epitaxial deposition rate is important to prevent nucleation of the silicon on the silicon dioxide layer. For most applications, it is undesirable for nucleation to occur on the silicon dioxide layer since a polycrystalline silicon layer will be formed. It has been found that the deposition rate of silicon in an epitaxial reactor varies as a function of the mol ratio of reactant to carrier, orientation of the deposition surface with respect to a particular crystallographic plane, the ratio of the area of the oxide mask to the area of the exposed silicon ratio, reaction temperature, and type of epitaxial reactor. A preferred growth rate is on the order of 0.75 microns per minute.

With respect to the composition of the deposition mask, it has been found that oxides, nitrides and mixtures of oxide and nitride can be used. Generally, the oxides and nitrides are compounds of the particular semiconductor material being deposited. Although the mask is referred to as composed of silicon dioxide in the embodiments disclosed, the above alternates will work as well.

While certain preferred embodiments of the invention have been disclosed, the invention is equally applicable to other embodiments. While the illustrated and described embodiments employ silicon as the single crystal material, other materials may be employed, such as germanium and gallium arsenide which also belong to the face-centered cubic crystal system. The invention is not, however, limited to face-centered cubic crystals but is applicable to other crystallographic structures which include planes upon which growth can preferentially be conducted.

What is claimed is:

1. A method for the manufacture of dielectrically isolated semiconductor devices comprising:

a. planarizing a monocrystalline semiconductor substrate to provide a surface parallel to a selected crystallographic plane;

b. epitaxially depositing a semiconductor material at predetermined sites on said substrate to provide a plurality of deposited regions, each having at least one p-n junction therein;

c. forming a dielectric coating on the deposited semiconductor material;

d. depositing a reinforcing material on the dielectric coating to a depth sufficient to substantially fill the spaces between the deposited regions;

e. removing the original substrate to expose surfaces of the epitaxial structures;

f. then planarizing the reinforced surface of the structure to reexpose the opposite surfaces of the epitaxial structures; and g. then selectively metallizing both surfaces of the composite structure to establish ohmic contact to selected portions of both surfaces of said epitaxial structures.

2. A method as in claim 1 wherein the initial substrate is monocrystalline silicon planarized to provide a surface parallel to a (110) plane.

3. A method as in claim 1 wherein the epitaxial growth is controlled by doping to provide first regions of one conductivity type, and adjacent regions thereon of opposite conductivity type to provide a single p-n junction at each growth site.

4. A method as in claim 1 wherein said epitaxial growth is controlled by selective doping to provide a first region of one conductivity type at each site, covered by second regions of opposite conductivity type, covered by third regions of said one conductivity type, whereby the ultimate structure produced comprises a plurality of transistor devices interconnected by selective metallization.

5. A method as in claim 1 wherein said predetermined sites for epitaxial growth are defined by an apertured mask comprising silicon dioxide.

6. A method as in claim 1 wherein said semiconductor comprises silicon and wherein said reinforcing material comprises polycrystalline silicon.

7. A method as in claim 4 wherein said transistors are provided with ohmic contact by a sequence of steps comprising selective preferential etching through a region of one conductivity type to expose the intermediate region of opposite conductivity type; followed by the formation of an apertured window in the etched area and subsequent metallization to establish direct ohmic connection to the intermediate region, concurrently with metallization of the remaining two regions of the respective devices.

* * * * *